(12) United States Patent
Lee

(10) Patent No.: US 7,733,719 B2
(45) Date of Patent: Jun. 8, 2010

(54) METHOD AND SYSTEM OF ANALYZING FAILURE IN SEMICONDUCTOR INTEGRATED CIRCUIT DEVICE

(75) Inventor: Jong-hyun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 272 days.

(21) Appl. No.: 11/902,413

(22) Filed: Sep. 21, 2007

(65) Prior Publication Data
US 2008/0080277 A1    Apr. 3, 2008

(30) Foreign Application Priority Data
Sep. 29, 2006  (KR) .................. 10-2006-0096065

(51) Int. Cl.
*G11C 29/00*  (2006.01)
(52) U.S. Cl. .................. 365/201; 365/191; 365/200
(58) Field of Classification Search .......... 365/201, 365/200, 191; 714/42, 718; 371/21.1
See application file for complete search history.

(56) References Cited

U.S. PATENT DOCUMENTS 5,844,850 A * 12/1998 Tsutsui et al. ............... 365/200
6,009,545 A * 12/1999 Tsutsui et al. ............... 714/718
6,016,278 A *  1/2000 Tsutsui et al. ............... 365/200
6,091,249 A    7/2000 Talbot et al.
6,610,550 B1 *  8/2003 Pasadyn et al. .............. 438/14
2002/0078405 A1 *  6/2002 Tomioka ..................... 714/42

FOREIGN PATENT DOCUMENTS

| KR | 1998-070482    | 10/1998 |
|----|----------------|---------|
| KR | 10-2002-0008108 | 1/2002  |
| KR | 10-2002-0079901 | 10/2002 |
| KR | 1020030083563  | 10/2003 |
| KR | 1020050020012  | 3/2005  |
| KR | 10-2006-0063380 | 6/2006  |

OTHER PUBLICATIONS

Korean Notice of Allowance dated Mar. 6, 2008.
Korean Office Action dated Sep. 28, 2007.
* KR 1998-070482 corresponds with US 6,091,249.

* cited by examiner

*Primary Examiner*—Pho M. Luu
(74) *Attorney, Agent, or Firm*—Harness, Dickey & Pierce, P.L.C.

(57) ABSTRACT

A method of analyzing a failure in a semiconductor integrated circuit device may including storing defects and analog characteristics correlated with the defects in a database, detecting a fail bit in a first wafer, measuring analog characteristics of the fail bit in the first wafer, and identifying which defect has caused the fail bit by comparing the measured analog characteristics with the stored analog characteristics.

22 Claims, 6 Drawing Sheets

METHOD AND SYSTEM OF ANALYZING FAILURE IN SEMICONDUCTOR INTEGRATED CIRCUIT DEVICE

PRIORITY STATEMENT

This U.S. non-provisional application claims priority from Korean Patent Application No. 10-2006-0096065 filed on Sep. 29, 2006 in the Korean Intellectual Property Office (KIPO), the disclosure of which is incorporated herein by reference in its entirety.

BACKGROUND

1. Field

Example embodiments relate to a method and system of analyzing a failure in a semiconductor integrated circuit device.

2. Description of the Related Art

A variety of conventional failure analyzing techniques are available, including, for example, a defect inspecting method, a physical analysis method, an electrical characteristic measuring method, etc. In the defect inspecting method, the external appearance of a wafer is inspected whenever each of a plurality of production processes is performed, and the position and size of a defect are inspected. In the physical analysis method, a defect of a wafer is directly detected by physically deprocessing the wafer after completely processing the wafer. In the electrical characteristic measuring method, the position of a fail bit is detected and a yield, e.g., a proportion of good chips among all the chips (or dies), is detected by measuring the electrical characteristics of SRAM cells after completing a wafer fabrication process.

However, these conventional failure analyzing techniques are difficult to perform on a large scale and are time-consuming. In addition, the defect inspecting method involves performing inspection whenever each of a plurality of production processes is performed, which may increase a manufacturing time and labor cost, ultimately increasing the cost of semiconductor chips. Furthermore, as design rules gradually decrease and semiconductor processes become more complicated, it is not possible to achieve satisfactory failure analysis results simply by performing the electrical characteristic measuring method.

SUMMARY

Example embodiments provide a fast and accurate method of analyzing a failure in a semiconductor integrated circuit device.

Example embodiments provide a fast and accurate system of analyzing a failure in a semiconductor integrated circuit device.

According to an example embodiment, a method of analyzing a failure in a semiconductor integrated circuit device may include storing defects and analog characteristics correlated with the defects in a database, detecting a fail bit in a first wafer, measuring analog characteristics of the fail bit in the first wafer, and identifying which defect has caused the fail bit by comparing the measured analog characteristics with the stored analog characteristics.

According to an example embodiment, a method of analyzing a failure in a semiconductor integrated circuit device may include performing defect inspection on a first wafer in the course of a production process of the first wafer to detect a defect in the first wafer, after completing formation of the first wafer, performing an electrical test on the first wafer to detect a defective SRAM cell in the first wafer, measuring the analog characteristics of a defective SRAM cell in the first wafer, verifying whether the defect in the first wafer is correlated with the analog characteristics of the defective SRAM cell, storing in the database information on the defect in the first wafer and the measured analog characteristics, which have been verified as being correlated with each other, performing an electrical test on a second wafer after completing production of the second wafer to detect a defective SRAM cell in the second wafer, measuring the analog characteristics of the defective SRAM cell in the second wafer, and identifying the defect that has caused the defective SRAM cell by comparing the measured analog characteristics with the stored analog characteristics.

According to an example embodiment, a system of analyzing a failure in a semiconductor integrated circuit device may include a database storing defects and analog characteristics correlated with the defects, an electrical tester that detects a fail bit in a wafer, an analog characteristic tester that measures analog characteristics of the fail bit in the wafer, and an analyzer that identifies the defect that has caused the fail bit by comparing the measured analog characteristics with the stored analog characteristics.

BRIEF DESCRIPTION OF THE DRAWINGS

Example embodiment will be described in detail with reference to the attached drawings.

DETAILED DESCRIPTION OF THE INVENTION

Figure 1:
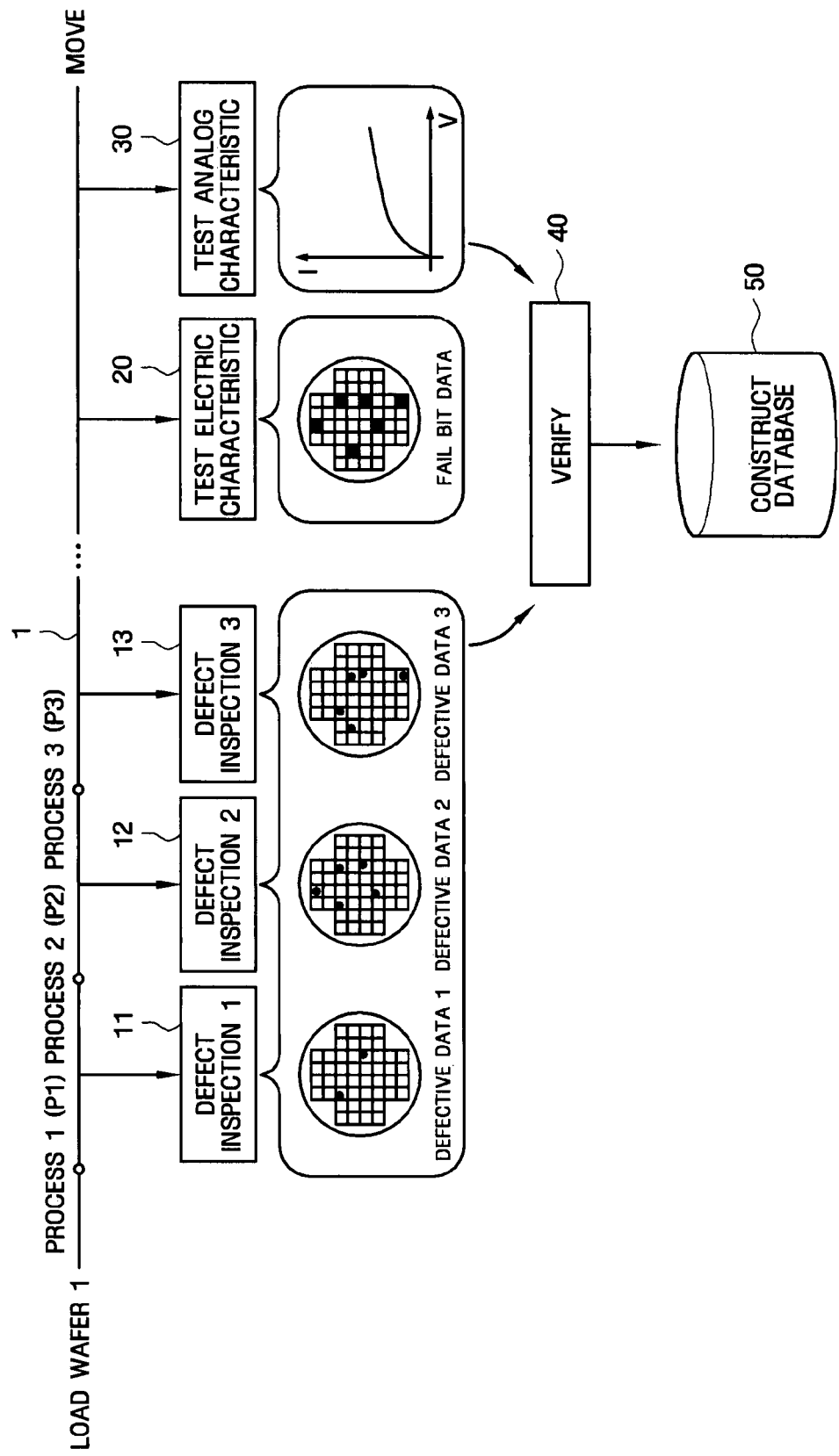
FIGS. 1 and 2 are diagrams illustrating a method of analyzing a failure in a semiconductor integrated circuit device according to an example embodiment.

Example embodiments will be described more fully with reference to the accompanying drawings. Example embodiments may, however, be embodied in many different forms and should not be construed as being limited to example embodiments set forth herein. Rather, these example embodiments are provided so that this disclosure will be thorough and will fully convey the scope to those skilled in the art. Like reference numerals refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
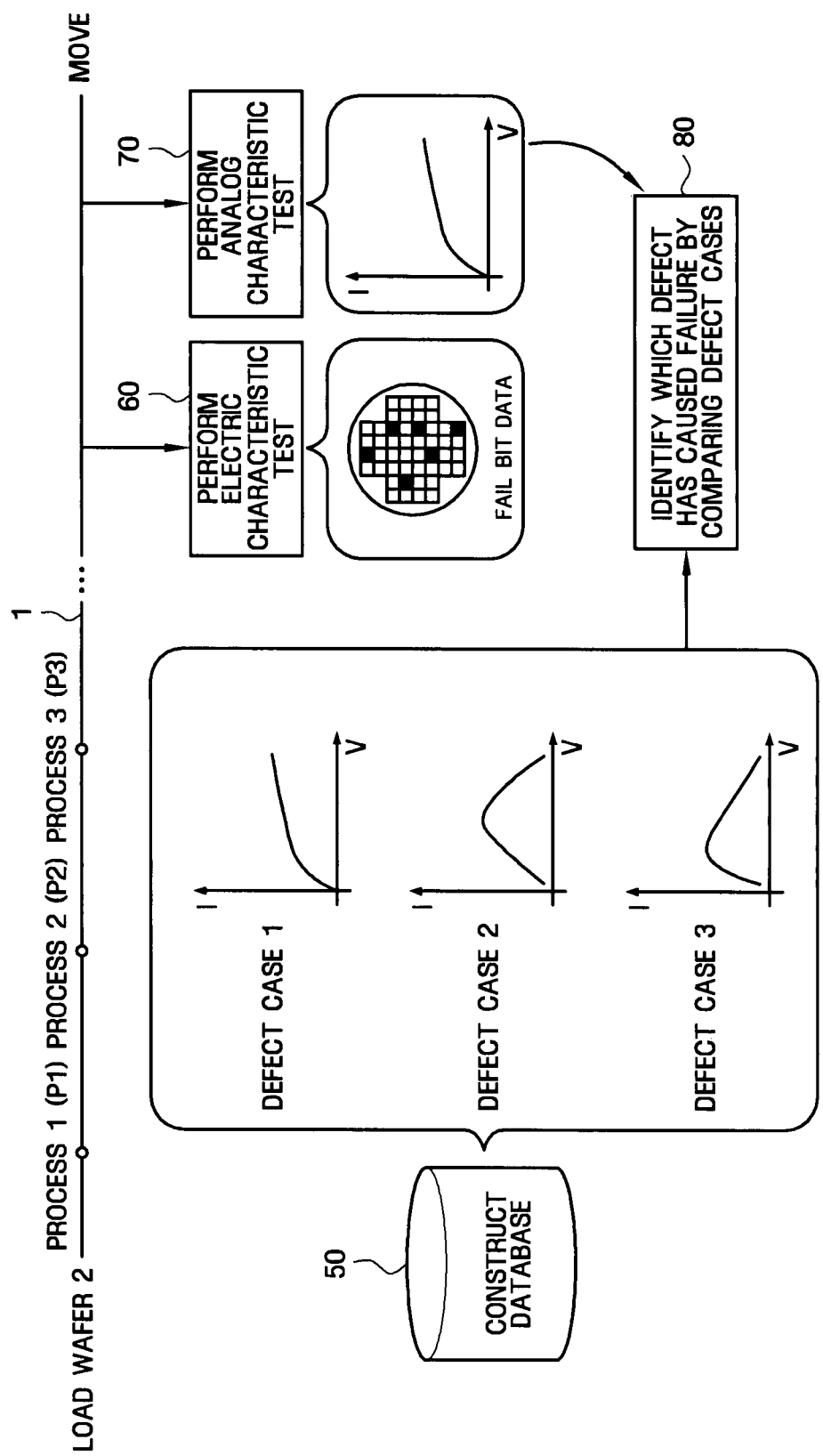

FIGS. 1 and 2 are diagrams illustrating a method of analyzing a failure in a semiconductor integrated circuit device according to an example embodiment. In detail, FIG. 1 illustrates a method of producing a database that stores defects and analog characteristics of fail bits that are correlated with the defects, and FIG. 2 illustrates a method of detecting a defect causing a failure using the database constructed in the method of FIG. 1.

Referring to FIG. 1, a production line 1 may include a process 1 (P1), a process 2 (P2), and a process 3 (P3), and production apparatuses may be arranged corresponding to the respective processes. If a first wafer W1 is loaded to the production line 1, the production line 1 may be sequentially processed in the order of P1, P2 and P3. A plurality of chips may be simultaneously produced within the first wafer W1 through the processes P1, P2 and P3. In an example embodiment, the semiconductor integrated circuit device may include a memory region having a plurality of memory cells arrayed in two dimensions, and each memory cell may be an SRAM cell.

Defect inspection 11, 12, 13 may be performed whenever each of the processes P1, P2 and P3 is performed, for example, whenever each layer is formed on the first wafer W1. In the defect inspection 11, 12, 13, the external appearance of the wafer W1 may be inspected by optical inspection or scanning to detect a defect or defects formed on the external appearance of the wafer W1. For example, the defect may include foreign materials, defect patterns, and the like, but are not limited thereto. The foreign material may be a material formed within the production apparatuses in the course of the production process, leftovers remaining after the production process, etching residue, dust, or the like, and the size of the foreign material may range from about 0.1 µm to about several hundreds of micrometers. The defect pattern may be an unwanted pattern formed during a photolithography or etching process, for example, a hillock, a change in color or the like.

Examples of the defect inspecting apparatus may include, but are not limited to, KLA 21 manufactured by KLA Inc., SURF SCAN 7 manufactured by TENCON Inc., WI880 manufactured by Hitachi, Ltd., or the like.

Data of the defect obtained by the defect inspection 11, 12, 13 may include position (represented by an address of x-y coordinates, for example), photo, size, type, frequency. The defect data may differ somewhat depending on the kind of defect inspecting apparatus used. In the defect data illustrated in FIG. 1, large circles indicate wafers, squares within each wafer indicate chips (or dies), and black marks indicate defects. For example, the defect data shown in FIG. 1 is marked by positions of defects within each wafer. However, data produced in an actual defect tester may be different from the data shown in FIG. 1.

An electrical test may be performed in operation 20. In operation 20, the cause of a fail bit may be identified by measuring electric characteristics of memory cells in each chip of a semiconductor wafer produced in the production line 1 (that is, after completing the production process). For example, in operation 20, data is written in the memory cell and then read from the memory cell. If data read from the memory cell is different from the identified fail bit, the memory cell may be defined as a fail bit.

Examples of the electrical tester performing the electrical test (operation 20) may include, but are not limited to, J937 manufactured by Teradyne Inc., T5365P manufactured by Advantest Inc. or the like.

Fail bit data obtained in operation 20 of testing the electric characteristics may include fail bit position (e.g., represented by x-y address), failure mode (e.g., a 1-bit failure, a 2-bit failure, a block failure, etc.), a yield, or the like. Here, the yield means a proportion of good chips among all the chips. For example, the good chips do not contain defective bits, while bad chips do contain defective bits. In the fail bit data illustrated in FIG. 1, large circles indicate wafers, black squares within each wafer indicate bad chips, and white squares indicate good chips.

Figure 3:
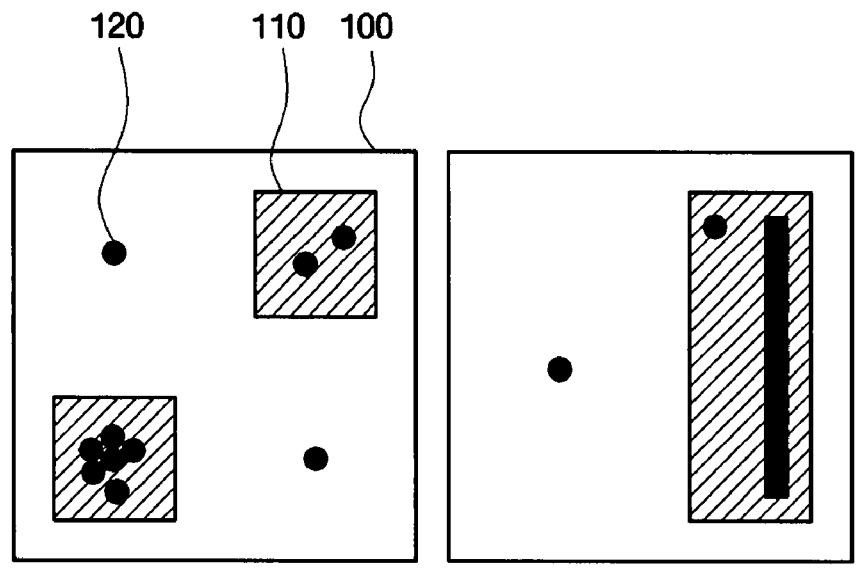
FIG. 3 illustrates a method of matching the position of a failure with the position of a fail bit.

In operation 30, an analog characteristic test may be performed to measure analog characteristics of a fail bit in the first wafer W1. In particular, in the measuring of the analog characteristics of the fail bit, the analog characteristics of the fail bit may be detected only if a defect position obtained through the defect inspection 11, 12, 13 matches the fail bit position obtained through the electrical test. However, matching the defect position with the fail bit position may be performed in various manners. For example, if addresses of the defect and fail bit are closer, it may be determined that the defect position matches the fail bit position. In FIG. 3, large squares 100 indicate chips, hatched small squares 110 indicate fail bits, and black marks 120 indicate defects. If black marks 120 are positioned in hatched small squares 110, it may be determined that defect position and fail bit position are matched to each other.

Figure 4:
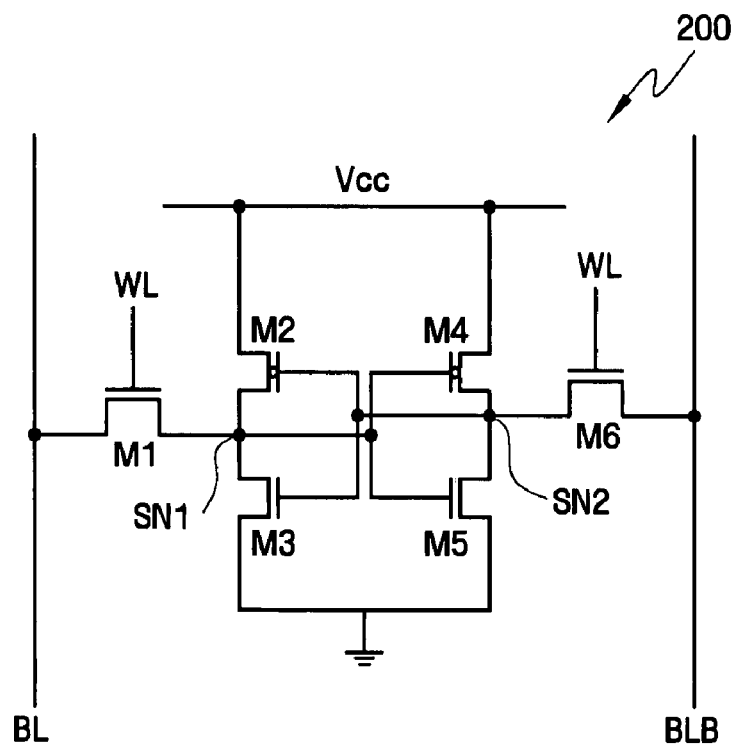
FIG. 4 is a circuit diagram of a static random access memory (SRAM) cell.

The analog characteristic test (operation 30) is performed to identify the cause of the fail bit. In the following description, an explanation will be given according to an example embodiment in which the bit is an SRAM cell (200). As shown in FIG. 4, the SRAM cell 200, which consists of 6 transistors, is defined in a region where bit lines (BL, BLB) and word line (WL) cross over. For example, pull-up transistors (M2, M4) and pull-down transistors (M3, M5) may constitute cross-coupled inverters, and access transistors M1, M6) may be connected to storage nodes (SN1, SN2), respectively. If the output of the SRAM cell 200 and the output bar thereof have symmetricity with respect to each other, the symmetricity may be useful in analyzing the analog characteristics of the SRAM cell 200. Ideally, if the SRAM cell 200 is perfectly balanced in view of opposing sides thereof, there may be no skew in the output and output bar of the SRAM cell 200. It should be noted that it would be obvious to those skilled in the art that in addition to the SRAM cell, example embodiments may be applied to a DRAM cell, a flash cell, a PRAM cell, a RRAM cell, a MRAM cell, etc.

In the analog characteristic test (operation 30), a specific voltage may be applied to a bit line (BL), a bit line bar (BLB), and a word, line (WL). Current flowing through at least one of among the six transistors M1~M6 may be measured at the bit line (BL) or the bit line bar (BLB).

Various biasing conditions for the SRAM cell 200 are show in Table 1. The biasing conditions shown in Table 1 are proposed only for illustration, but the example embodiments are not limited thereto.

TABLE 1

| Biasing condition | Bit line (BL) | Bit line Bar (BLB) | Word line (WL) |
| --- | --- | --- | --- |
| A | Sweep & Measure | Vcc | Vcc |
| B | Sweep | Vcc & Measure | Vcc |
| C | Vcc | Sweep & Measure | Vcc |
| D | Vcc & Measure | Sweep | Vcc |

In the biasing condition a, while sweeping the bit line (BL) from 0 V to a predetermined voltage, e.g., 1 V, a change in the current may be measured at the bit line (BL). In the biasing condition b, while sweeping the bit line (BL), a change in the current may be measured at the bit line bar (BLB). In the biasing condition c, while sweeping the bit line bar (BLB), a change in the current may be measured at the bit line bar (BLB). In the biasing condition d, while sweeping the bit line bar (BLB), a change in the current may be measured at the bit line (BL). In the respective biasing conditions, the current flowing may be measured through at least one of an access transistor (M1 or M6), a pull-up transistor (M2 or M4), and a pull-down transistor (M3 or M5).

Figure 5:
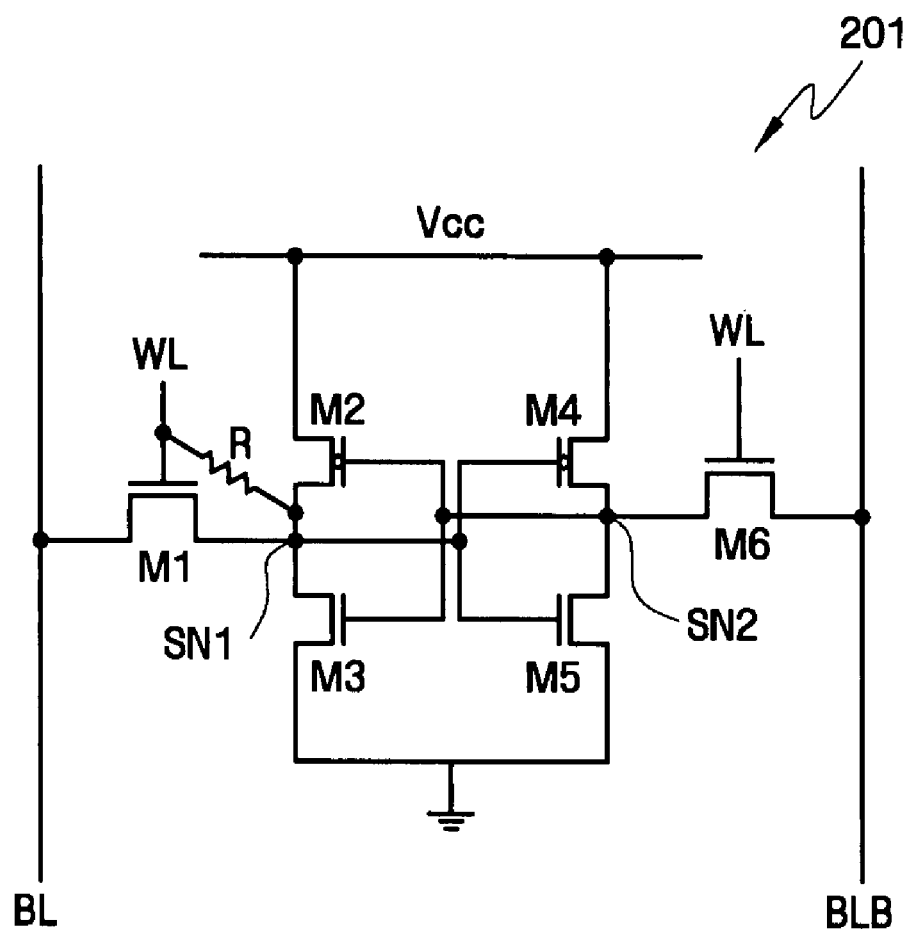
FIG. 5 is a modeled circuit diagram of a defective SRAM cell.
Figure 6:
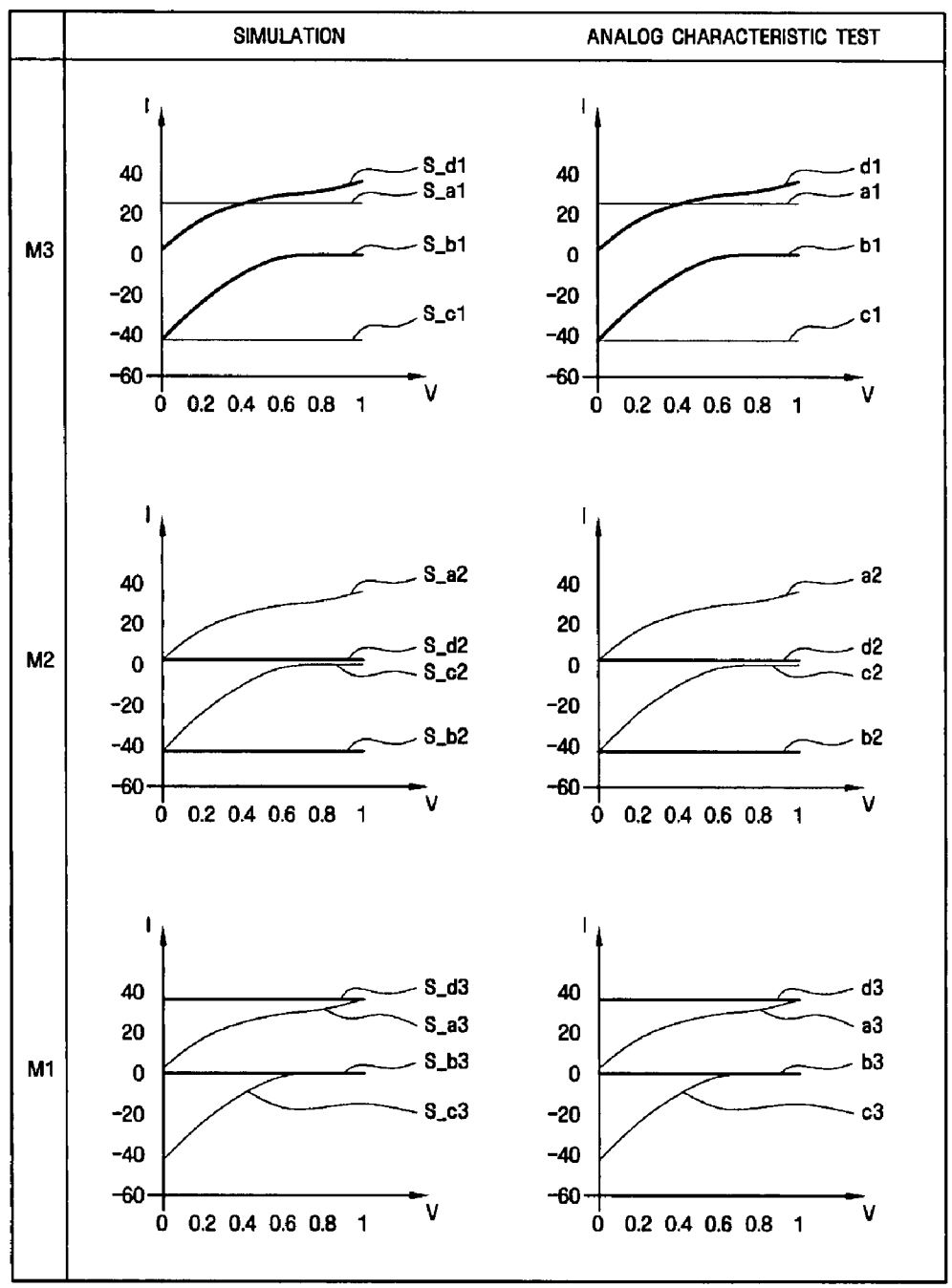
FIG. 6 illustrates comparison results of simulated analog characteristics and measured analog characteristics of the defective SRAM cell shown in FIG. 5.

FIG. 5 is a modeled circuit diagram of a defective SRAM cell. FIG. 6 illustrates comparison results of simulated analog characteristics and measured analog characteristics of the defective SRAM cell shown in FIG. 5.

In operation 40, it may be verified whether the defect in the first wafer W1 is correlated with the measured analog characteristics. For example, a photo of a defect matched with a fail bit may be examined and a circuit 201 reflecting the defect is modeled. FIG. 5 shows a modeled circuit, according to an example embodiment, having a bridge (R) between a storage node (SN1) and a word line (WL).

The modeled circuit 201 may be simulated to discover analog characteristics. In FIG. 6, simulation curves s_a1, s_b1, s_c1, and s_d1 indicate waveforms of current flowing through the pull-down transistor (M3) of the modeled circuit 201 under the biasing conditions a, b, c, and d. Simulation curves s_a2, s_b2, s_c2, and s_d2 indicate waveforms of current flowing through the pull-up transistor (M2) of the modeled circuit 201 under the biasing conditions a, b, c, and d. Simulation curves s_a3, s_b3, s_c3, and s_d3 indicate waveforms of current flowing through the access transistor (M1) of the modeled circuit 201 under the biasing condition a, b, c, and d.

The simulated analog characteristics and the measured analog characteristics may be compared. In FIG. 6, the analog characteristic curves a1, b1, c1, and d1 are waveforms of current flowing through the pull-down transistor (M3) of the defective SRAM cell in the first wafer (W1) under the biasing conditions a, b, c, and d, respectively. The analog characteristics curves a2, b2, c2, and d2 are waveforms of current flowing through the pull-up transistor (M2) of the defective SRAM cell in the first wafer (W1) under the biasing conditions a, b, c, and d, respectively. The analog characteristics curves a3, b3, c3, and d3 are waveforms of current flowing through the access transistor (M1) of the defective SRAM cell in the first wafer (W1) under the biasing conditions a, b, c, and d, respectively.

If a simulation curve and an analog characteristic curve (for example, s_a1 and a1, or s_b1 and b1) are substantially the same with each other under the same biasing condition, it may be determined that the wafer in the first wafer (W1) is correlated with the measured analog characteristics. Here, the determination may be made in various manners. For example, if a coefficient of correlation between a simulation curve and an analog characteristic curve is obtained and the coefficient of correlation exceeds a predetermined reference value, e.g., 0.9, it may be determined that the simulation curve and the analog characteristic curve are substantially the same with each other. Because the simulation curve and the analog characteristic curve shown in FIG. 6 are substantially the same with each other, it may be determined that they are correlated with each other.

The defect and analog characteristics of the fail bit, which have been verified as being correlated with each other, may be stored in the database 50.

To construct the database 50, the defect inspection 11, 12, 13, each including the electrical test (operation 20), the analog characteristic test (operation 30), and the verification (operation 40), may be repeatedly performed on a plurality of wafers. The more data accumulated by repeatedly performing the defect inspection 11, 12, 13 for the plurality of wafers, the higher the reliability of the data stored in the database 50.

In repeatedly performing the defect inspection on the plurality of wafers, there may be one or more types of defects that are correlated with analog characteristics of a fail bit. Namely, an analog characteristic of a fail bit and a defect type may not correspond with each other in one-to-one relationship. This is because even the same analog characteristics may be presented for different defect types (as viewed from different photos obtained through the defect inspection 11, 12, 13). For example, if a bridge occurs between a node and another node, the occurrence of the bridge may be at a substrate level or at a wiring level. Even if the bridge has occurred at either the substrate level or the wiring level, modeled circuits reflecting the bridge may be the same as each other and analog characteristics curves resulting from the bridge may be the same as each other.

An example of the constructed database is illustrated in Table 2. According to an example embodiment, where there are a variety of types of defects that are correlated with analog characteristics of a fail bit, all the correlated defects may be stored, and frequencies of the respective defects may also be stored. For example, in case A (leakage between a storage node and a word line), 3 types of defects (A1, A2, A3) that are correlated with the analog characteristics, and frequencies 100, 25, and 10 for the respective defects, may be stored in the database.

In table 2, the failure mode covers, but is not limited to, case A (leakage between a storage node and a word line), case B (leakage between a power supply voltage (Vcc) and a storage node), and case C (leakage between a storage node and a ground voltage (Vss)). Example embodiments are not limited to the illustrated example. In Table 2, marks "-" indicate that images are viewed.

fied and provided. For example, a coefficient of correlation between a curve for the measured analog characteristics and a curve for the analog characteristics stored in the database 50 may be calculated, and the analog characteristics stored in the database 50 may be detected, the analog characteristics having curves in which the magnitude of the coefficient of correlation exceeds a predetermined reference value, e.g., 0.9. As described above, curves of one or more similar analog characteristics may be classified and provided, while one or more defects stored together with the analog characteristics in the database may be provided. In this case, frequencies of the one or more defects stored in the database may also be provided together.

Table 3 shows an example of a relationship between measured analog characteristics, one or more similar analog characteristics, and defect providing types. In table 3, marks "-" indicate that images are viewed.

TABLE 2

| Case | Failure mode | Analog Characteristic | Defect Type | Defect Photo | Defect Frequency |
|---|---|---|---|---|---|
| A | Leakage between Storage Node and Word line | — | A1 | — | 100 |
|   |   |   | A2 | — | 25 |
|   |   |   | A3 | — | 10 |
| B | Leakage between Vcc and Storage Node | — | B1 | — | 200 |
|   |   |   | B2 | — | 150 |
| C | Leakage between Storage Node and Vss | — | C1 | — | 20 |
|   |   |   | C2 | — | 15 |

Referring to FIG. 2, if a second wafer W2 is loaded to a production line 1, the production line 1 may be sequentially processed in the order of a process 1 (P1), a process 2 (P2), and a process 3 (P3). Through the processes P1, P2 and P3, a plurality of chips of a semiconductor integrated circuit device may be produced within the second wafer W2. In the example embodiment shown in FIG. 2, defect inspection 11, 12, 13 may not necessarily be performed whenever each of the respective processes P1, P2 and P3 is processed.

An electric characteristic test may be performed after the production process to detect a fail bit within the second wafer (W2) in operation 60.

In table 3, measured analog characteristics and similar analog characteristics are provided in descending order of similarity. Namely, in case A, measured analog characteristics of a defect may be the most similar to analog characteristics of the defect. In case G, measured analog characteristics of a defect may be less similar to analog characteristics of the defect than in case A. Then, in case K, measured analog characteristics of a defect may be much less similar to analog characteristics of the defect than in case A. Because defect type and defect frequency are also provided for each case, it may be inferred that the measured analog characteristics are most likely derived from a defect type A1.

TABLE 3

| Measured Analog Characteristic | Order | Similar Analog Characteristic | Case | Defect Type | Defect Photo | Defect Frequency |
|---|---|---|---|---|---|---|
| — | 1 | — | A | A1 | — | 100 |
|   |   |   |   | A2 | — | 25 |
|   |   |   |   | A3 | — | 10 |
|   | 2 | — | G | G1 | — | 10 |
|   |   |   |   | G2 | — | 8 |
|   | 3 | — | K | K1 | — | 70 |

In operation 70, an analog characteristic test may be performed on a fail bit in the second wafer (W2). Here, the analog characteristics are indicated by curves of currents measured under the biasing conditions shown in Table 1.

In operation 80, it may be identified which defect has caused a failure by comparing measured analog characteristics with the analog characteristics stored in the database 50. Namely, among multiple analog characteristics stored in the database 50, one or more analog characteristics which are similar to the measured analog characteristics may be classi- In an example embodiment, because defects and analog characteristics are stored in a database to perform failure analysis, defect inspection may not need to be performed in the course of a production process. In addition, according to example embodiments, defects that are most highly correlated with measured analog characteristic may be easily detected. Therefore, the failure analyzing method and system according to the example embodiments may perform analysis failure in a faster, more accurate manner, compared to the conventional failure analysis method and system.

Figure 7:
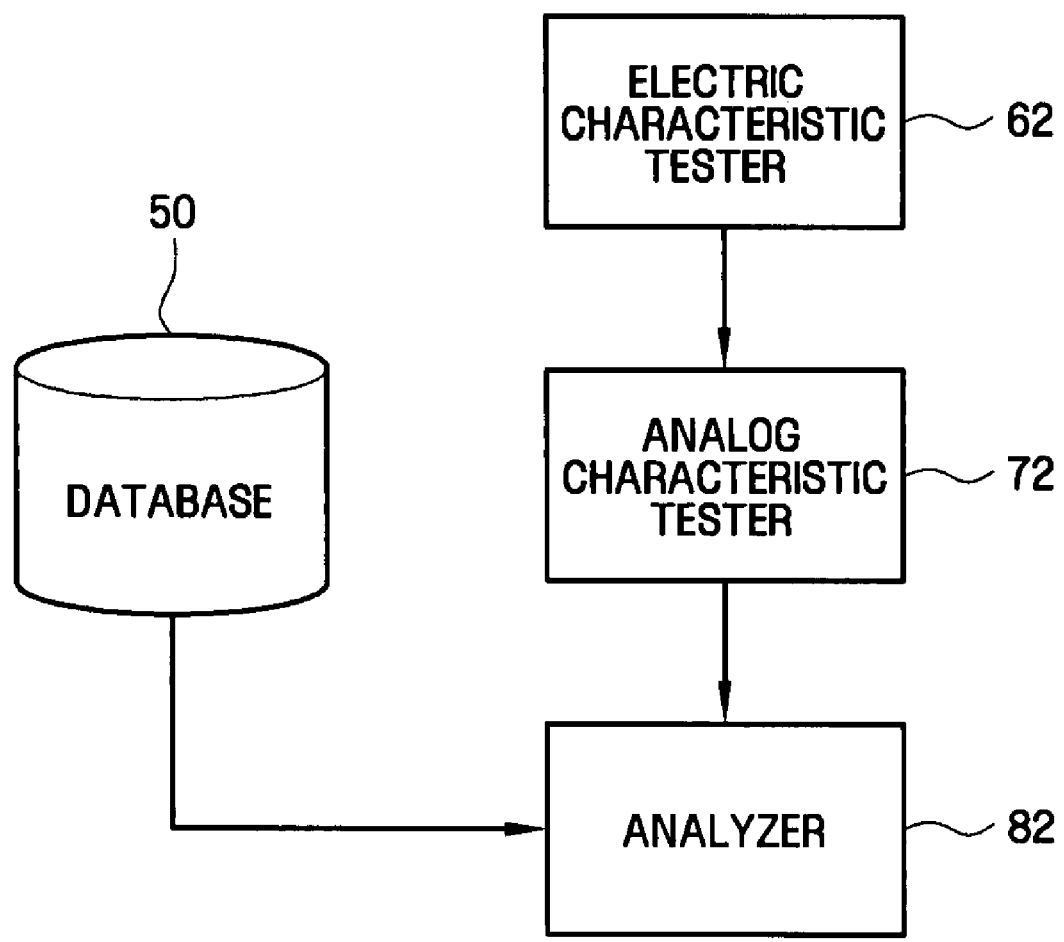
FIG. 7 is a block diagram of a system of analyzing a failure in a semiconductor integrated circuit device according to an example embodiment.

FIG. 7 is a block diagram of a system of analyzing a failure in a semiconductor integrated circuit device according to an example embodiment. FIG. 7 is an example illustration of the failure analyzing method shown in FIG. 2, but is not limited thereto.

Referring to FIG. 7, a system of analyzing a failure in a semiconductor integrated circuit device, according to an example embodiment, may include a database 50, an electrical tester 62, an analog characteristic tester 72, and an analyzer 82.

The database 50 may store defects and analog characteristics of fail bits that are correlated with the defects. If there are a variety of types of defects that are correlated with the analog characteristics, all the correlated defects may be stored in the database 50 and frequencies of the respective defects may also be stored in the database 50. Data stored in the database 50 are as shown in Table 2.

The electrical tester 62 may measure electric characteristics of a memory cell in a chip produced through a production line, and may detect a fail bit in the memory cell. The electrical tester 62 may measure where the fail bits are located. For example, the electrical tester 62 may write data in the memory cell, and then read the data from the memory cell. If the data read from the memory cell is different from the written data, the memory cell may be defined as a fail bit.

The analog characteristic tester 72 may measure analog characteristics of the fail bit in a wafer. If the bit is an SRAM cell, the analog characteristic tester 72 may measure the magnitude of current under the biasing conditions shown in Table 1.

The analyzer 82 may identify which defect has caused the fail bit by comparing the measured analog characteristics with the analog characteristics stored in the database 50. The analyzer 82 may classify and provide one or more analog characteristics which are similar to the analog characteristics measured by the electrical tester 62, among multiple analog characteristics stored in the database 50. In this case, if the one or more similar analog characteristics are classified and provided, one or more defects stored together with the analog characteristics in the database may also be simultaneously provided. In addition, frequencies of the one or more defects stored in the database may also be provided together.

Although not shown in the drawing, in the construction of the database 50, a defect inspector for detecting a defect in a wafer (see W1 of FIG. 1) may be provided. In the course of constructing the database 50, the electrical tester 62 may detect a fail bit in the first wafer (W1), the analog characteristic tester 72 may measure analog characteristics of the fail bit in the first wafer (W1), and the analyzer 82 may verify whether the defect in the first wafer (W1) is correlated with the analog characteristics of the fail bit and may store in the database 50 the defect and analog characteristics of the fail bit verified as being correlated with each other.

As described above, according to example embodiments, because defects and analog characteristics are stored in a database to perform failure analysis, defect inspection may not need to be performed in the course of a production process. In addition, according to example embodiments, defects that are most highly correlated with measured analog characteristic may be easily detected. Accordingly, example embodiments may provide a fast and accurate failure analysis method and system.

While example embodiments have been particularly shown and described, it will be understood by those of ordinary skill in the art that various changes in form and details may be made therein without departing from the spirit and scope. It is therefore desired that example embodiments be considered in all respects as illustrative and not restrictive.

What is claimed is:

1. A method of analyzing a failure in a semiconductor integrated circuit device, the method comprising:
   storing defects and analog characteristics correlated with the defects in a database;
   detecting a fail bit in a first wafer;
   measuring analog characteristics of the fail bit in the first wafer; and
   identifying which defect has caused the fail bit by comparing the measured analog characteristics with the stored analog characteristics, wherein one or more kinds of defects are correlated with the analog characteristics of the fail bit.

2. The method of claim 1, wherein the storing defects and analog characteristics correlated with the defects in a database comprises:
   detecting a defect in a second wafer;
   detecting a fail bit in the second wafer;
   measuring analog characteristics of the fail bit in the second wafer;
   verifying whether the defect in the second wafer is correlated with the measured analog characteristics; and
   storing in the database information on the defect in the second wafer and the measured analog characteristics, which have been verified as being correlated with each other.

3. The method of claim 2, wherein the detecting of the defect in the second wafer comprises:
   performing defect inspection on the second wafer in the course of the production process of the second wafer to obtain the position of the defect on the external appearance of the second wafer.

4. The method of claim 2, wherein the detecting of the fail bit in the second wafer comprises:
   performing an electrical test on the second wafer after completing production of the second wafer to obtain the position of the fail bit.

5. The method of claim 2, wherein the measuring of the analog characteristics of the fail bit comprises:
   measuring the analog characteristics of the fail bit, whose position is matched with the position of the defect.

6. The method of claim 2, wherein the verifying whether the defect in the second wafer is correlated with the measured analog characteristics comprises:
   modeling a circuit reflecting the defect; and
   comparing analog characteristics obtained through simulation of the modeled circuit with the measured analog characteristics.

7. The method of claim 1, wherein the bit is defined in a region in which a bit line, a bit line bar, and a word line cross over, and is a SRAM (Static Random Access Memory) cell consisting of six transistors, and the measuring of the analog characteristics of the fail bit comprises:
   measuring the analog characteristics of the transistors of the SRAM cell.

8. The method of claim 7, wherein the measuring of the analog characteristics of the transistors comprises:
   applying a specific voltage to the bit line, the bit line bar, and the word line and measuring current flowing through at least one of the six transistors.

9. The method of claim 1, wherein the identifying of which defect has caused the fail bit comprises:
   detecting one or more analog characteristics similar to the measured analog characteristics from the analog characteristics stored in the database; and providing the detected similar analog characteristics together with one or more defects correlated with the similar analog characteristics.

10. The method of claim 9, wherein the providing of the detected similar analog characteristics comprises:
providing one or more defects correlated with the detected similar analog characteristics together with the defect frequency of each of the one or more defects.

11. A method of analyzing a failure in a semiconductor integrated circuit device, the method comprising:
performing defect inspection on a first wafer in the course of a production process of the first wafer to detect a defect in the first wafer;
after completing formation of the first wafer, performing an electrical test on the first wafer to detect a defective SRAM cell in the first wafer;
measuring the analog characteristics of a defective SRAM cell in the first wafer;
verifying whether the defect in the first wafer is correlated with the analog characteristics of the defective SPAM cell;
storing in the database information on the defect in the first wafer and the measured analog characteristics, which have been verified as being correlated with each other;
performing an electrical test on a second wafer after completing production of the second wafer to detect a defective SRAM cell in the second wafer;
measuring the analog characteristics of the defective SPAM cell in the second wafer; and
identifying the defect that has caused the defective SRAM cell by comparing the measured analog characteristics with the stored analog characteristics.

12. The method of claim 11, wherein defect inspection is not performed on the second wafer in the course of the production process of the second wafer.

13. The method of claim 11, wherein the verifying whether the defect in the first wafer is correlated with the analog characteristics of the defective SRAM cell comprises:
modeling a circuit reflecting the defect and comparing analog characteristics obtained through simulation of the modeled circuit with the measured analog characteristics.

14. The method of claim 11, wherein the identifying of the defect that has caused the defective SRAM cell comprises:
detecting one or more analog characteristics similar to the measured analog characteristics from the analog characteristics stored in the database; and
providing the detected similar analog characteristics together with one or more defects correlated with the similar analog characteristics.

15. A system of analyzing a failure in a semiconductor integrated circuit device, the system comprising:

a database storing defects and analog characteristics correlated with the defects;
an electrical tester that detects a fail bit in a wafer;
an analog characteristic tester that measures analog characteristics of the fail bit in the wafer; and
an analyzer that identifies the defect that has caused the fail bit by comparing the measured analog characteristics with the stored analog characteristics, wherein one or more kinds of defects are correlated with the analog characteristics of the fail bit.

16. The system of claim 15, wherein the electrical tester detects a defect in a first wafer, the analog characteristic tester measures analog characteristics of the fail bit in the first wafer, and the analyzer identifies the defect that has caused the fail bit by comparing the measured analog characteristics with the stored analog characteristics.

17. The system of claim 16, further comprising:
a defect inspector that performs defect inspection on a second wafer different from the first wafer to detect a defect in the second wafer.

18. The system of claim 17, wherein the electrical tester detects a defect in the second wafer, the analog characteristic tester measures analog characteristics of the fall bit in the second wafer, and the analyzer verifies whether the defect in the second wafer is correlated with the measured analog characteristics and stores in the database information on the defect in the second wafer and the measured analog characteristics, which have been verified as being correlated with each other.

19. The system of claim 15, wherein the fall bit is defined in a region in which a bit line, a bit line bar, and a word line cross over, and is a SRAM (Static Random Access Memory) cell consisting of six transistors, and the measuring of the analog characteristics of the fall bit comprises measuring the analog characteristics of the transistors of the SRAM cell.

20. The system of claim 19, wherein the analog characteristic tester applies a specific voltage to the bit line, the bit line bar, and the word line and measures current flowing through at least one among the six transistors.

21. The system of claim 19, wherein the analyzer detects one or more analog characteristics similar to the measured analog characteristics from the analog characteristics stored in the database and provides the detected similar analog characteristics together with one or more defects that are correlated with the similar analog characteristics.

22. The system of claim 21, wherein the analyzer provides one or more defects correlated with the detected similar analog characteristics together with the defect frequency of each of the one or more defects.

* * * * *